US010735006B1

(12) United States Patent
Kho et al.

(10) Patent No.: US 10,735,006 B1
(45) Date of Patent: Aug. 4, 2020

(54) FUNCTIONAL CLOCK GENERATION

(71) Applicant: Infineon Technologies AG, Neubiberg (DE)

(72) Inventors: Rex Kho, Holzkirchen (DE); Udo Elsholz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/451,317

(22) Filed: Jun. 25, 2019

(51) Int. Cl.
*H03L 7/099* (2006.01)
*G06F 1/08* (2006.01)

(52) U.S. Cl.
CPC ............... *H03L 7/099* (2013.01); *G06F 1/08* (2013.01)

(58) Field of Classification Search
CPC .................................. H03L 7/099; G06F 1/08
USPC ........................................................ 375/376
See application file for complete search history.

(56) References Cited

U.S. PATENT DOCUMENTS

2006/0034403 A1* 2/2006 Huang ................. H03L 7/0891
375/354
2006/0267690 A1* 11/2006 Osada ................... H03L 7/0995
331/1 A
2013/0199293 A1* 8/2013 Durston ............. G01C 19/5684
73/504.13

* cited by examiner

*Primary Examiner* — Kevin M Burd
(74) *Attorney, Agent, or Firm* — Schiff Hardin LLP

(57) ABSTRACT

A functional clock generator, including: an oscillator configured to generate an oscillator clock having an oscillator clock frequency; a control value generator configured to generate control values to ramp the oscillator clock frequency between a first frequency and a second, higher frequency; a Phase-Locked Loop (PLL) configured to generate a PLL clock having the second frequency; and a selector configured to switch between selecting the oscillator clock and the PLL clock as a functional clock when the oscillator clock frequency and the PLL clock frequency are substantially equal.

17 Claims, 3 Drawing Sheets

100
Functional Clock Generator

100
Functional Clock Generator

200
Functional Clock Generator

300
Method of Generating a Functional Clock

400
Method of Generating a Functional Clock

FUNCTIONAL CLOCK GENERATION

BACKGROUND

Functional clock switching, such as during a mode change, can cause current jumps that exceed a power management system's reaction capability, resulting in a system reset or failure. In order to counteract this problem, a power management system is either overdesigned, or alternatively, a clock frequency during switching is stepped from a start frequency to a target frequency. The frequency step sizes can be controlled by either switching between multiple clock generators or by controlling frequency division stages in a Phase Locked Loop (PLL). These frequency step sizes are limited by an upper frequency of the PLL and a number of integer steps in the divider circuitry. Fractional division is an option, but an average clock period is generated using a combination of low and high period clocks. While the resulting average current jump is lower, peak current jumps remain unchanged. Thus, there is a need for generation of smaller current jumps with reasonable granularity.

DETAILED DESCRIPTION

The present disclosure is directed to a functional clock generator having a Phase Locked Loop (PLL) and a secondary oscillator which is used at startup during the PLL's locking phase, or during operation when the PLL loses lock or fails.

Figure 1:
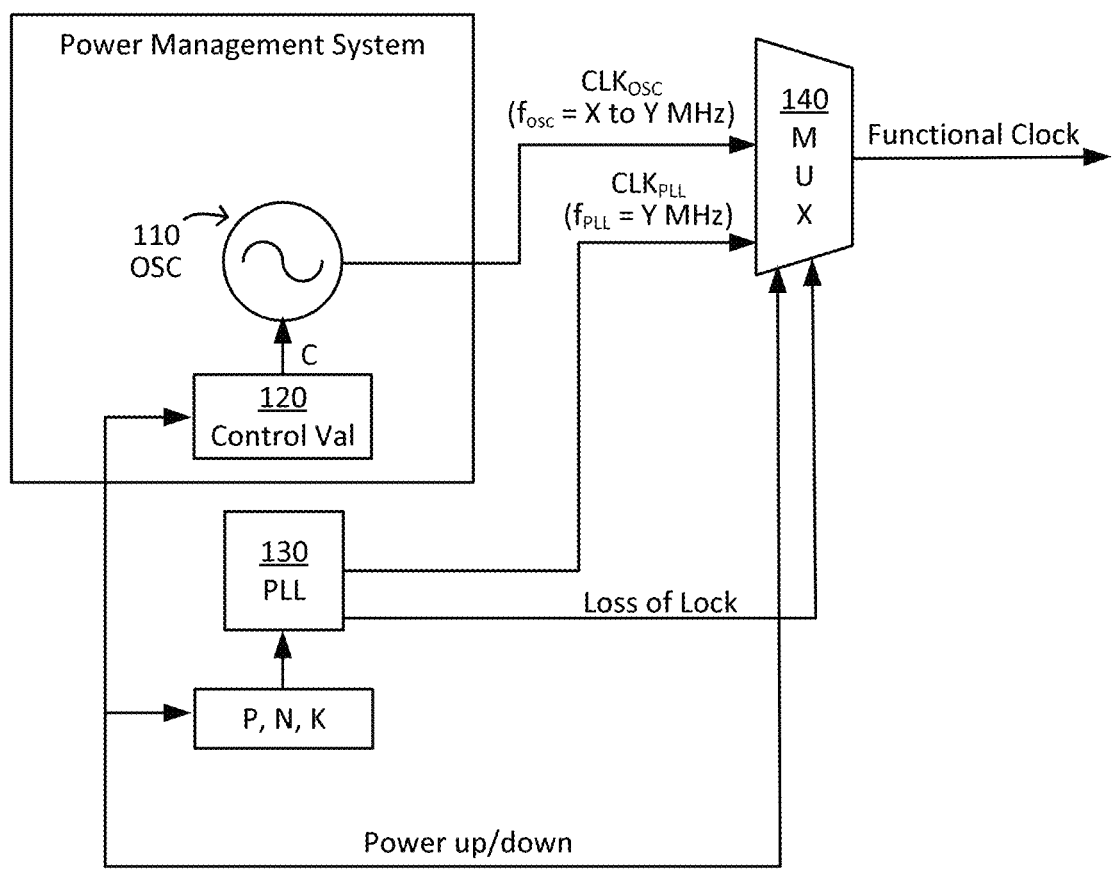
FIG. 1 illustrates a schematic diagram of a functional clock generator in accordance with aspects of the disclosure.

FIG. 1 illustrates a schematic diagram of a functional clock generator 100 in accordance with aspects of the disclosure.

The functional clock generator 100 comprises an oscillator 110, a control value generator 120, a Phase-Locked Loop (PLL) 130, and a selector 140.

The oscillator 110 is configured to generate an oscillator clock $CLK_{OSC}$ having an oscillator clock frequency $f_{OSC}$. The oscillator 110 is trimmed during manufacture for accuracy, and is a secondary oscillator to the PLL 130. The oscillator 110 has a frequency accuracy which is lower than that of the PLL, but this does not pose a problem as a high accuracy oscillator is not required.

The control value generator 120 is configured to generate control values C to ramp the oscillator clock frequency $f_{OSC}$ between a first frequency X MHz and a second, higher frequency Y MHz. The control value generator 120 may comprise a state machine. The state machine generates the control values C used to control trimming bits of the oscillator 110 and thereby modify step size.

Initially the oscillator clock $CLK_{OSC}$ is the functional clock, and the oscillator clock $CLK_{OSC}$ starts at a first frequency X MHz. The control value generator 120 is configured to generate the control values C to ramp the oscillator clock frequency $f_{OSC}$ in monotonically increasing steps. The oscillator 110 and the control value generator 120 may be comprised within a power management system.

The PLL 130 is configured to generate a PLL clock $CLK_{PLL}$ having the second frequency Y, which is higher than the first frequency X MHz. The PLL 130 is controlled by PLL parameter settings P (pre-divider), N (feedback divider), and/or K (final divider). These PLL parameter settings may be changed to generate different PLL clock frequencies $CLK_{PLL}$ at the output of the PLL 130. This PLL control is known, and for the sake of brevity, is not described further here.

The selector 140 is configured to switch between selecting the oscillator clock $CLK_{OSC}$ and the more accurate PLL clock $CLK_{PLL}$ as a functional clock when the oscillator clock frequency $f_{OSC}$ reaches the PLL clock frequency $f_{PLL}$, or reaches slightly less than the PLL clock frequency $f_{PLL}$ due to inaccuracy of the oscillator 110. At this point the oscillator clock frequency $f_{OSC}$ reaches the PLL clock frequency $f_{PLL}$ are substantially equal, and thus frequency and current glitches are reduced. The selector 140 may be configured to switch from selecting the oscillator clock $CLK_{OSC}$ to the PLL clock $CLK_{PLL}$ as the functional clock after the PLL 130 enters a locked state. The selector 130 may be a multiplexor, and is configured to receive a loss of lock control signal from the PLL 130.

After this initial switching, the selector 140 may be configured to switch from selecting the PLL clock $CLK_{PLL}$ to the oscillator clock $CLK_{OSC}$ as the functional clock, when the PLL 130 is in an unlocked or failure state. The unlocked state occurs when the PLL 130 losses lock. The failure state may occur when the PLL 130 is of insufficient quality to be used as a functional clock. The oscillator clock $CLK_{OSC}$ would have remained at an oscillator frequency $f_{OSC}$ of Y MHz from the ramping at system startup. And after the switch back to the oscillator clock frequency $f_{OSC}$, the control value generator 120 may be configured to generate the control values C, as described above, to ramp the oscillator clock frequency $f_{OSC}$ back down in monotonically decreasing steps from Y MHz to X MHz.

The control value generator 120, the parameters of the PLL 130, and the selector 140 may controlled by power up/down control signal from hardware, software, or firmware.

Figure 2:
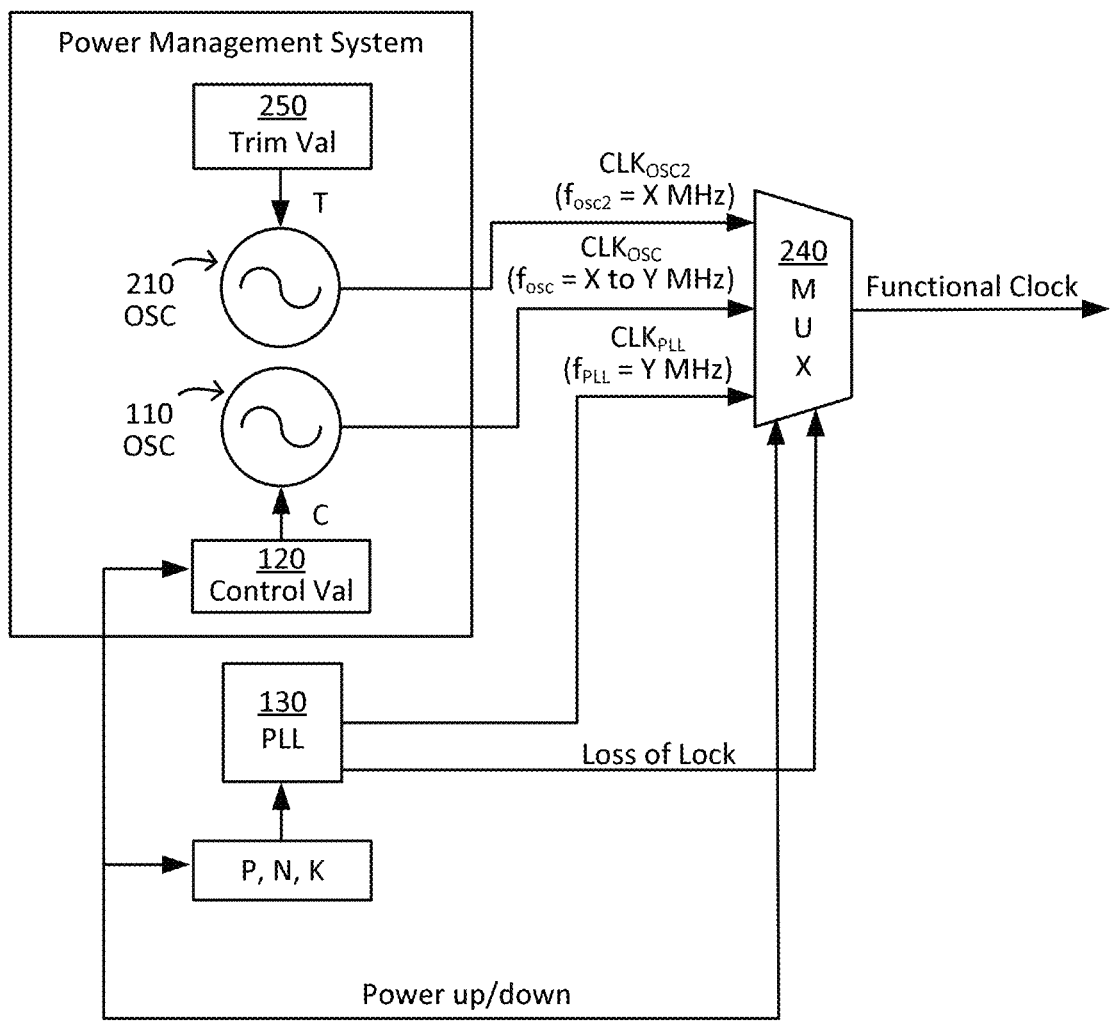
FIG. 2 illustrates a schematic diagram of another functional clock generator in accordance with aspects of the disclosure.

FIG. 2 illustrates a schematic diagram of another functional clock generator 200 in accordance with aspects of the disclosure.

The functional clock generator 200 is similar to the functional clock generator 100 of FIG. 1, except that the functional clock generator 200 comprises a second oscillator 210 and a trim value generator 250 configured to generate trim values T to control trimming bits of the second oscillator 210. The second oscillator 210 is configured to generate a second oscillator clock $CLK_{OSC2}$ having a frequency $f_{OSC2}$ which is substantially equal to the first oscillator clock frequency X MHz. The second oscillator 210 may be on a different power domain that the oscillator 110. This second oscillator 210 may be used during a low power mode.

The selector 240 is configured to select between the oscillator clock $CLK_{OSC}$, the second oscillator clock $CLK_{OSC2}$, and the PLL clock $CLK_{PLL}$ as the functional clock. Thus the selector 240 is configured to select between three clocks rather than two clocks (PLL clock $CLK_{PLL}$ and oscillator clock $CLK_{OSC}$), as in the case of selector 140. Selector 240, as with selector 140, may be a multiplexor.

Figure 3:
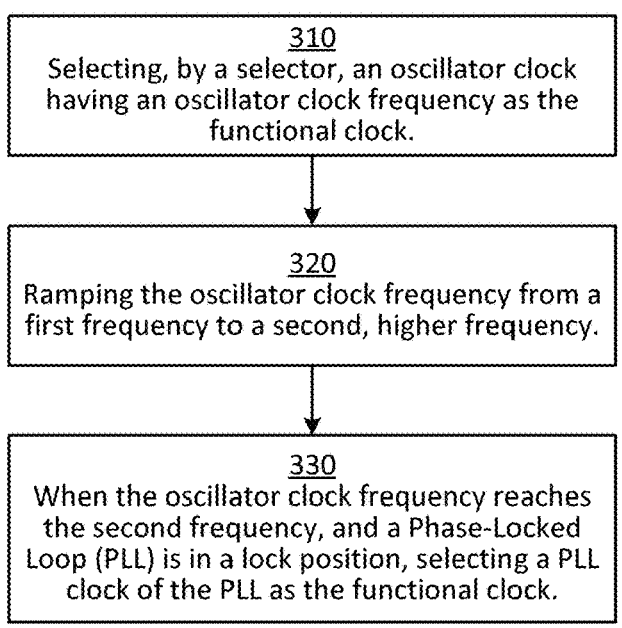
FIG. 3 illustrates a flowchart of a method of generating a functional clock in accordance with aspects of the disclosure.

FIG. 3 illustrates a flowchart 300 of a method of generating a functional clock in accordance with aspects of the disclosure.

At Step 310, selecting, by a selector 130, an oscillator clock $CLK_{OSC}$ having an oscillator clock frequency $f_{OSC}$ as the functional clock. This selection may be at system startup, and the oscillator clock $CLK_{OSC}$ starts at a first oscillator clock frequency $f_{OSC}$ of X MHz. Also, this selection may be when the PLL 130 losses lock or fails.

At Step 320, ramping the oscillator clock frequency $f_{OSC}$ from the first frequency X MHz to a second, higher frequency Y MHz. This ramping may occur when the PLL 130 is in a process of going from an unlocked state to a locked state. The oscillator clock frequency $f_{OSC}$ is ramped using the control values C to control the oscillator's trimming bits. The accuracy of the oscillator clock frequency ramp is not critical, but the oscillator clock ramp should monotonically increase or decrease such that the frequency steps are within previously determined parameters.

At Step 330, when the oscillator clock frequency $f_{OSC}$ reaches the second frequency Y MHz, and a PLL 130 is in a lock position, selecting a more accurate PLL clock $CLK_{PLL}$ of the PLL 130 as the functional clock. Further, after the switching, the oscillator clock frequency may be switched from the second frequency Y MHz to the first frequency X MHz in a case of PLL loss of lock or failure.

Figure 4:
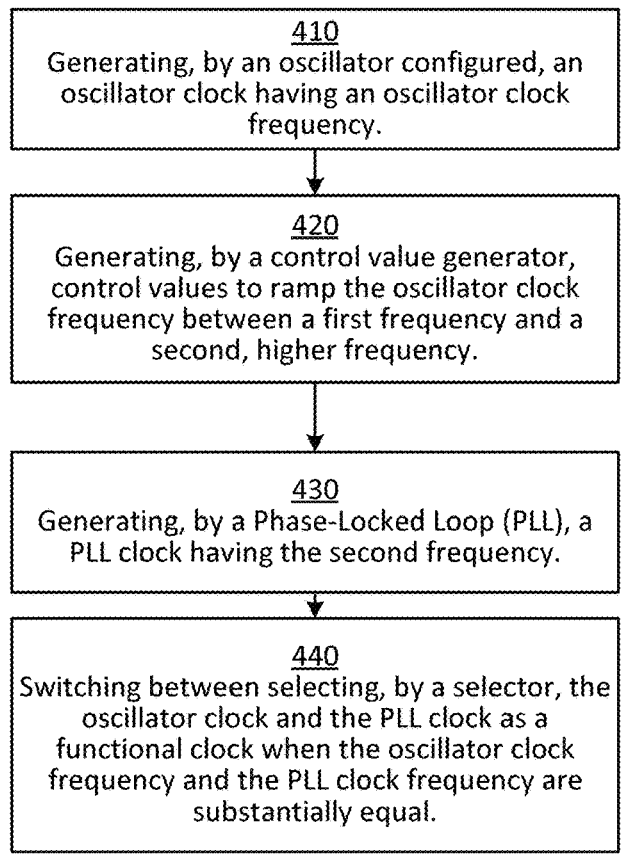
FIG. 4 illustrates a flowchart of another method of generating a functional clock in accordance with aspects of the disclosure.

FIG. 4 illustrates a flowchart 400 of another method of generating a functional clock in accordance with aspects of the disclosure.

At Step 410, generating, by an oscillator 110, an oscillator clock $CLK_{OSC}$ having an oscillator clock frequency $f_{OSC}$.

At Step 420, generating, by a control value generator 120, control values C to ramp the oscillator clock frequency $f_{OSC}$ between a first frequency X MHz and a second, higher frequency Y MHz. The generating the control values C may comprise generating the control values C to ramp the oscillator clock frequency $f_{OSC}$ in monotonically increasing steps. Also, the generating the control values C may comprise generating the control values C to ramp the oscillator clock frequency $f_{OSC}$ in monotonically decreasing steps.

At Step 430, generating, by a PLL 130, a PLL clock $CLK_{PLL}$ having the second frequency Y MHz.

At Step 440, switching between selecting, by a selector 240, the oscillator clock ($CLK_{OSC}$ or $OSC_{CLK2}$) and the PLL clock $CLK_{PLL}$ as a functional clock when the oscillator clock frequency ($f_{OSC}$ or $f_{OSC2}$) and the PLL clock frequency $f_{PLL}$ are substantially equal. The switching may comprise switching from selecting the oscillator $CLK_{OSC}$ clock to the PLL clock $CLK_{PLL}$ as the functional clock after the PLL 130 enters a locked state. The switching may comprise switching from selecting the PLL clock $CLK_{PLL}$ to the oscillator clock $CLK_{OSC}$ as the functional clock when the PLL 130 losses lock or is in failure.

The functional clock generators and methods disclosed herein are advantageous in that the oscillator clock $CLK_{OSC}$ can be a simple oscillator as its accuracy requirements are not stringent. The frequency ramping steps of the oscillator clock $CLK_{OSC}$ may be arbitrarily large or small and are simple to control, but the frequency ramping should increase or decrease monotonically. The frequency ramping steps of the oscillator clock $CLK_{OSC}$ does not have P (pre-divider), N (feedback divider), and/or K (final divider) step size limitations. And the frequency ramping of the oscillator clock $CLK_{OSC}$ can occur in parallel to the PLL lock.

The techniques of this disclosure may also be described in the following examples.

Example 1

A functional clock generator, comprising: an oscillator configured to generate an oscillator clock having an oscillator clock frequency; a control value generator configured to generate control values to ramp the oscillator clock frequency between a first frequency and a second, higher frequency; a Phase-Locked Loop (PLL) configured to generate a PLL clock having the second frequency; and a selector configured to switch between selecting the oscillator clock and the PLL clock as a functional clock when the oscillator clock frequency and the PLL clock frequency are substantially equal.

Example 2

The functional clock generator of example 1, wherein the selector is configured to switch from selecting the oscillator clock to the PLL clock as the functional clock after the PLL enters a locked state.

Example 3

The functional clock generator of any combination of examples 1-2, wherein when the PLL is in an unlocked state, the selector is configured to select the oscillator clock as the functional clock.

Example 4

The functional clock generator of any combination of examples 1-3, wherein when the PLL is in a failure state, the selector is configured to select the oscillator clock as the functional clock.

Example 5

The functional clock generator of any combination of examples 1-4, wherein the selector is configured to switch from selecting the PLL clock to the oscillator clock as the functional clock when the PLL losses lock.

Example 6

The functional clock generator of any combination of examples 1-5, wherein the control value generator is configured to generate the control values to ramp the oscillator clock frequency in monotonically increasing steps.

Example 7

The functional clock generator of any combination of examples 1-6, wherein the control value generator is configured to generate the control values to ramp the oscillator clock frequency in monotonically decreasing steps.

Example 8

The functional clock generator of any combination of examples 1-7, wherein the control values control trimming bits of the oscillator.

Example 9

The functional clock generator of any combination of examples 1-8, wherein the control value generator comprises a state machine.

Example 10

The functional clock generator of any combination of examples 1-9, further comprising: a second oscillator configured to generate a second oscillator clock having the first oscillator clock frequency, wherein the selector is configured to select between the oscillator clock, the second oscillator clock, and the PLL clock as the functional clock.

Example 11

A method of generating a functional clock, comprising: selecting, by a selector, an oscillator clock having an oscillator clock frequency as the functional clock; ramping the oscillator clock frequency from a first frequency to a second, higher frequency; and when the oscillator clock frequency reaches the second frequency, and a Phase-Locked Loop (PLL) is in a lock position, selecting a PLL clock of the PLL as the functional clock.

Example 12

The method of example 11, further comprising: switching, by the selector when the PLL losses lock or fails, selection of the PLL clock to the oscillator clock as the functional clock.

Example 13

The method of any combination of examples 11-12, further comprising: after the switching, ramping the oscillator clock frequency from the second frequency to the first frequency.

Example 14

The method of any combination of examples 11-13, wherein the ramping comprises: generating, by a control value generator, control values to control trimming bits of the oscillator.

Example 15

The method of any combination of examples 11-14, wherein the ramping comprises: generating, by a control value generator, control values to ramp the oscillator clock frequency in monotonically increasing or decreasing steps.

Example 16

A method of generating a functional clock, comprising: generating, by an oscillator, an oscillator clock having an oscillator clock frequency; generating, by a control value generator, control values to ramp the oscillator clock frequency between a first frequency and a second, higher frequency; generating, by a Phase-Locked Loop (PLL), a PLL clock having the second frequency; and switching between selecting, by a selector, the oscillator clock and the PLL clock as a functional clock when the oscillator clock frequency and the PLL clock frequency are substantially equal.

Example 17

The method of example 16, wherein the switching comprises switching from selecting the oscillator clock to the PLL clock as the functional clock after the PLL enters a locked state.

Example 18

The method of any combination of examples 16-17, wherein the switching comprises switching from selecting the PLL clock to the oscillator clock as the functional clock when the PLL losses lock or is in failure.

Example 19

The method of any combination of examples 16-18, wherein the generating the control values comprises generating the control values to ramp the oscillator clock frequency in monotonically increasing steps.

Example 20

The method of any combination of examples 16-19, wherein the generating the control values comprises generating the control values to ramp the oscillator clock frequency in monotonically decreasing steps.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A functional clock generator, comprising:
   an oscillator configured to generate an oscillator clock having an oscillator clock frequency;
   a control value generator configured to generate control values to ramp the oscillator clock frequency between a first frequency and a second, higher frequency;
   a Phase-Locked Loop (PLL) configured to generate a PLL clock having the second frequency; and
   a selector configured to switch between selecting the oscillator clock and the PLL clock as a functional clock when the oscillator clock frequency and the PLL clock frequency are substantially equal and after the PLL enters a locked state.

2. The functional clock generator of claim 1, wherein when the PLL is in an unlocked state, the selector is configured to select the oscillator clock as the functional clock.

3. The functional clock generator of claim 1, wherein when the PLL is in a failure state, the selector is configured to select the oscillator clock as the functional clock.

4. The functional clock generator of claim 1, wherein the selector is configured to switch from selecting the PLL clock to the oscillator clock as the functional clock when the PLL losses lock.

5. The functional clock generator of claim 1, wherein the control value generator is configured to generate the control values to ramp the oscillator clock frequency in monotonically increasing steps.

6. The functional clock generator of claim 1, wherein the control value generator is configured to generate the control values to ramp the oscillator clock frequency in monotonically decreasing steps.

7. The functional clock generator of claim 1, wherein the control values control trimming bits of the oscillator.

8. The functional clock generator of claim 1, wherein the control value generator comprises a state machine.

9. The functional clock generator of claim 1, further comprising:
a second oscillator configured to generate a second oscillator clock having the first oscillator clock frequency,
wherein the selector is configured to select between the oscillator clock, the second oscillator clock, and the PLL clock as the functional clock.

10. A method of generating a functional clock, comprising:
selecting, by a selector, an oscillator clock having an oscillator clock frequency as the functional clock;
ramping the oscillator clock frequency from a first frequency to a second, higher frequency;
when the oscillator clock frequency reaches the second frequency, and a Phase-Locked Loop (PLL) is in a lock position, selecting a PLL clock of the PLL as the functional clock; and
switching, by the selector when the PLL losses lock or fails, selection of the PLL clock to the oscillator clock as the functional clock.

11. The method of claim 10, further comprising:
after the switching, ramping the oscillator clock frequency from the second frequency to the first frequency.

12. The method of claim 11, wherein the ramping comprises:
generating, by a control value generator, control values to control trimming bits of the oscillator.

13. The method of claim 10, wherein the ramping comprises:
generating, by a control value generator, control values to ramp the oscillator clock frequency in monotonically increasing or decreasing steps.

14. A method of generating a functional clock, comprising:
generating, by an oscillator, an oscillator clock having an oscillator clock frequency;
generating, by a control value generator, control values to ramp the oscillator clock frequency between a first frequency and a second, higher frequency;
generating, by a Phase-Locked Loop (PLL), a PLL clock having the second frequency;
switching between selecting, by a selector, the oscillator clock and the PLL clock as a functional clock when the oscillator clock frequency and the PLL clock frequency are substantially equal; and
switching from selecting the PLL clock to the oscillator clock as the functional clock when the PLL losses lock or is in failure.

15. The method of claim 14, wherein the switching comprises switching from selecting the oscillator clock to the PLL clock as the functional clock after the PLL enters a locked state.

16. The method of claim 14, wherein the generating the control values comprises generating the control values to ramp the oscillator clock frequency in monotonically increasing steps.

17. The method of claim 14, wherein the generating the control values comprises generating the control values to ramp the oscillator clock frequency in monotonically decreasing steps.

* * * * *